United States Patent [15] 3,641,448

Steckler [45] Feb. 8, 1972

[54] TRANSISTOR SIGNAL TRANSLATING STAGE

[72] Inventor: Steven Alan Steckler, Clark, N.J.

[73] Assignee: RCA Corporation

[22] Filed: Oct. 1, 1969

[21] Appl. No.: 862,759

[52] U.S. Cl. ....................330/18, 307/270, 307/303, 330/38 M

[51] Int. Cl. ....................H03f 3/42

[58] Field of Search ..........330/18, 20, 38, 38 M; 307/270, 307/303

[56] References Cited

UNITED STATES PATENTS

| | | | |
|---|---|---|---|
| 3,418,592 | 12/1968 | Soloman et al. | 330/38 X |
| 3,430,155 | 2/1969 | Harwood | 330/38 X |
| 3,445,776 | 5/1969 | Leidich | 330/18 X |
| 3,500,220 | 3/1970 | Buckley | 330/19 |

*Primary Examiner*—Roy Lake
*Assistant Examiner*—James B. Mullins
*Attorney*—Eugene M. Whitacre

[57] ABSTRACT

A signal translating circuit includes a constant current transistor, a variable conduction transistor having a signal input terminal, and a feedback loop coupling the transistors. The collector-emitter paths of the transistors are connected in series across a voltage source. An output transistor is electrically and thermally coupled to the variable conduction transistor to provide an output current which is proportional to and at a predetermined phase relationship with the input current. The circuit is characterized by having both a low impedance current input, and a high impedance voltage input. The direct voltage level of the input can be selected for suitable biasing of the preceding stage. The circuit can be employed, for example, as a current sampler, a linear amplifier, a Q-multiplier, or a signal-matrixing circuit.

17 Claims, 2 Drawing Figures

INTEGRATED CIRCUIT

INTEGRATED CIRCUIT

INVENTOR.
Steven A. Steckler
BY Eugene M. Whitacre
ATTORNEY

TRANSISTOR SIGNAL TRANSLATING STAGE

The present invention relates to a signal translating stage, and more particularly, to an electrical circuit having a direct voltage level at the input terminal which can be selected for coupling to a variety of input levels as required by a particular application. The circuit is further characterized by a highly linear transfer function and is thereby particularly suited to current sampling and linear amplifying applications.

In many single stage transistor amplifiers, as the amplitude of an input signal varies, the base-to-emitter forward voltage drop also varies nonlinearly and therefore produces distortion of the output signal. This effect is more pronounced when the magnitude of the input signal is increased. A circuit embodying the present invention may be utilized as a linear amplifier such that this undesirable distortion is alleviated. The current gain of an amplifier incorporating the present invention can be varied by selecting different relative emitter areas as described below without affecting the linearity.

One embodiment of the present invention provides a low input impedance and therefore is useful as a current sampling circuit which may be coupled serially in the path of the sampled current. When utilized in a resonant circuit, undesirable lowering of the Q of the tuned circuit is therefore prevented. This later application is described in detail in my copending application entitled "A CONTROLLED OSCILLATOR SYSTEM," Ser. No. 862,705. Further, the direct voltage at the input terminal may conveniently be adjusted to match the direct voltage level of the sampled circuit. The low impedance input further makes it possible to utilize another embodiment of the present invention to algebraically combine input signals with isolation between the inputs. Although the preferred embodiment of the present invention is constructed on a monolithic integrated circuit chip, other embodiments may utilize discrete components.

Circuits embodying the present invention include a transistor having a signal input circuit coupled to its collector electrode and a signal output circuit coupled to its base electrode.

A better understanding of the present invention and its operation can be obtained by reference to the figures and description thereof below.

Figure 1:
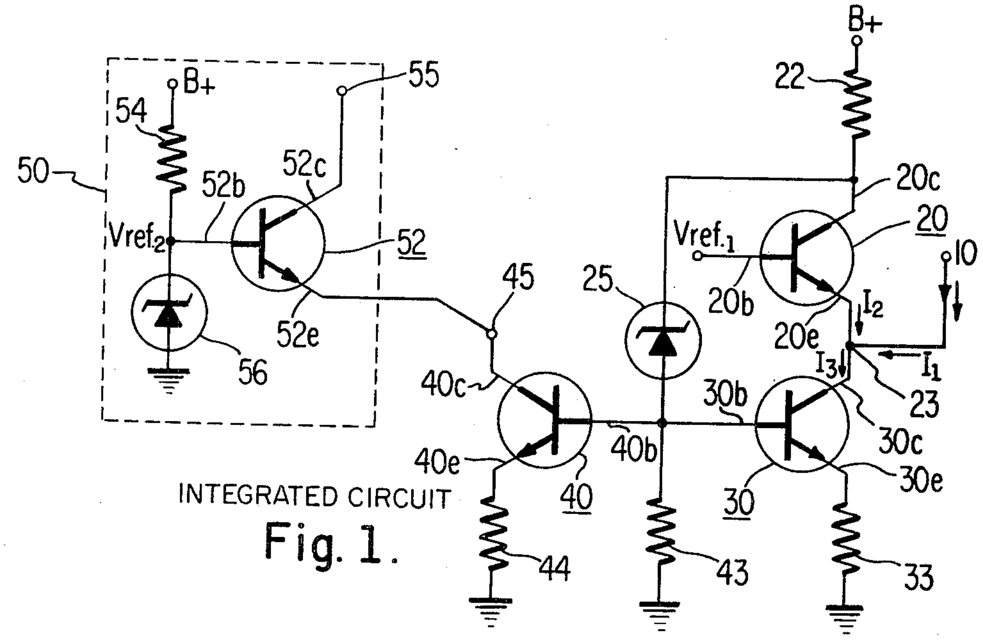
Figure 2:
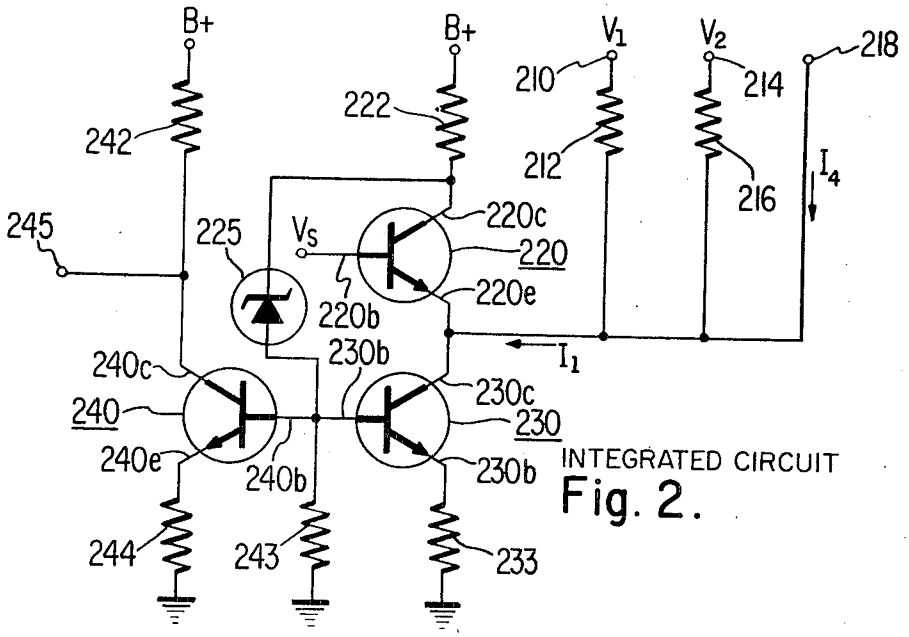

FIG. 1 illustrates in schematic diagram form a preferred embodiment of the present invention utilized as a current sampler; and FIG. 2 illustrates in schematic diagram form an embodiment of the present invention in an amplifier configuration.

Referring to FIG. 1, an input terminal 10 is coupled in the path of a current ($I_1$) to be sampled. A constant current stage comprising a transistor 20 includes an emitter electrode **20*e* coupled both to the input terminal 10 and to a collector electrode 30*c* of a variable conduction stage comprising a transistor 30. Operating power is coupled to the system via a B+ terminal which is coupled by means of a collector resistor 22 to a collector electrode 20*c* on transistor 20. A base electrode 20*b* on transistor 20 is coupled to a direct voltage reference potential illustrated by the symbol $V_{ref_1}$ in the figure. A feedback path from the collector electrode 20*c* of transistor 20 to a base electrode 30*b* of transistor 30 includes a zener diode 25 biased in the zener operating mode by resistive means 22 and 43 serially coupled from B+ to a reference potential such as ground. This feedback path couples voltage variations appearing at the collector of transistor 20 to the base electrode 30*b* of transistor 30. Zener diode 25 provides the required direct voltage translation to bias transistor 30**. This path may include other serially coupled solid-state devices (not shown) to provide signal coupling and direct voltage translation. Further, such an arrangement can provide temperature compensation.

An emitter resistor 33 couples an emitter electrode **30*e* of transistor 30 to ground. An emitter resistor 44 is coupled from an emitter electrode 40*e* of an output stage comprising a transistor 40 to ground. Transistor 40 is thermally and electrically coupled to transistor 30. A base electrode 40*b* on transistor 40 is coupled to a base electrode 30*b* on transistor 30 and to a junction of zener diode 25 and resistor 43. A collector electrode 40*c* provides means for supplying the output current from the current sampler directly to a first current output terminal 45. Alternately, the output current can be supplied via a further output stage 50** illustrated by the circuit enclosed within the dashed lines in the figure.

The second output stage includes a transistor 52 having an emitter electrode **52*e* coupled to current output terminal 45. A base electrode 52*b* of transistor 52 is coupled to a second reference voltage. This voltage may be developed utilizing a resistor 54 and a zener diode 56 serially coupled from B+ to ground as shown. The regulated voltage present across the zener diode is coupled to the base electrode 52*b*. A second current output terminal 55 coupled to a collector electrode 52*c* on transistor 52** supplies the output current.

The above-described current sampling circuit operates in the following manner. Current in transistor 20 is held relatively constant, since a direct reference voltage is applied to its base, and further, since the feedback path to variable conduction stage 30 operates to oppose any tendency for emitter current flowing in transistor 20 to increase or decrease. As current flowing in transistor 20 tends to increase, current flowing through collector resistor 22 will produce a larger voltage drop across this resistor and therefore, the voltage at collector terminal **20*c* will tend to decrease. This voltage change is coupled by device 25 to the base terminal 30*b* of transistor 30 and is of a polarity to tend to reduce the conduction of the transistor 30. Thus, transistor 20 will experience an effectively increased emitter resistance and its collector current will therefor tend to reduce to its fixed current level. If current in transistor 20 decreases, the opposite effect takes place, that is, a positive-going signal is coupled to base terminal 30*b* of transistor 30 which increases conduction of this transistor and therefore reduces the effective emitter load resistance on transistor 20 thus tending to return the current flowing in transistor 20 to a constant level. Defining signal input current as positive when flowing in the direction illustrated by the arrow accompanying the symbol $I_1$ in FIG. 1, emitter current in transistor 20 as positive when flowing as illustrated by the arrows accompanying the symbol $I_2$ in the figure, and active load current as positive when flowing in the direction illustrated by the arrow accompanying the symbol $I_3$ in the figure; it is possible to write a nodal current equation at junction point 23** in the figure. Thus, $$I_1+I_2=I_3$$

but $I_2$ is held relatively constant as explained above, therefore, variations in current $I_1$ must be effected by corresponding variations in $I_3$. When $I_1$ is positive and increasing, $I_3$ must increase also. This shunt regulation action utilizing negative feedback between the stages 20, 30 accomplishes the desired low input impedance at input terminal 10 which enables the circuit to be incorporated in current sampling applications.

Output current is generated by a parallely coupled output device such as transistor 40. In the preferred embodiment, transistors 40 and 30 are adjacently integrated on a single monolithic chip and therefore, are thermally coupled. Since base terminals **30*b* and 40*b* are coupled electrically and thermally, the base-emitter junction current density will be the same if the resistances of resistors 33 of transistor 30 and 44 of transistor 40 are in the inverse ratio as their respective base-emitter areas. Thus, collector current flowing in transistor 40 will be in phase with and related to current $I_3$ as the relative base-emitter areas. For example, if the base-emitter area of transistor 40 is approximately four times that of transistor 30, and the base-emitter current densities are equal, output current supplied to terminal 45 will be of a magnitude four times as great as collector current flowing in transistor 30. Likewise, varying the emitter resistors 33 and 44 can accomplish a variable magnitude relationship between the two currents. In the preferred embodiment, the resistances are chosen to equalize the base-emitter voltage drops across transistors 30 and 40**, although this may not be required in all applications. In some circuits, the emitter resistors may be omitted entirely.

Output current can be extracted from first output terminal 45, but it may be desirable to provide a second output stage 50 to restrict the collector voltage of transistor 40 at some direct reference voltage. This may be accomplished using an output circuit 50 as shown within the dashed lines. Such an arrangement provides improved current matching between transistors 30 and 40 since their respective collector voltages are fixed or the same. A resistance 54 and a zener diode 56 coupled from B+ to ground provide a reference direct voltage to a base terminal **52*b* of transistor 52, the emitter voltage of transistor 52 and, therefore, the collector voltage of transistor 40 will be fixed at this reference voltage value less the base to emitter forward voltage drop across the base-emitter junction of transistor 52. The collector current flowing in transistor 52 is coupled to a current output terminal 55 to supply the output current. The reference voltage applied to base terminal 52*b* of transistor 52** may be developed in any suitable manner, the embodiment shown is merely illustrative.

The negative feedback path from the collector terminal **20*c* of transistor 20 to the base terminal 40*b* of transistor 40 may include signal coupling and direct voltage translating means other than zener diode 25** shown. For example, additional diodes, transistors and capacitors can be employed to obtain the required signal coupling, direct voltage translation and temperature compensation.

An important feature of the present invention exists in that input terminal 10 can be supplied with the required direct voltage level to voltage match the present circuit to the preceding input stage. This is accomplished by selecting the reference voltage illustrated as $V_{ref_1}$ in the figure approximately to the level desired at terminal 10. This terminal coupled to the reference voltage by transistor 20 will be fixed to voltage $V_{ref_1}$ less the forward voltage drop across the base-emitter junction of transistor 20. In some applications, this voltage thus obtained at terminal 10 can be employed to bias a preceding stage. See, for example, my copending application entitled "A CONTROLLED OSCILLATOR SYSTEM," Ser. No. 862,705.

The present invention may further be utilized as an amplifier and/or matrixing circuit. Such an embodiment is illustrated in FIG. 2. Structure of FIG. 2 corresponds to that of FIG. 1 has the same identification number prefixed by numeral 2. Added are input resistances 212 and 216 and input terminals 210 and 214 which couple input signals to the circuit. Also a signal voltage can be applied to the base of transistor 220 as is illustrated in FIG. 2 by the symbol $V_s$. The collector resistor 242 of transistor 240 is responsive to collector current variations to develop an output voltage which can be extracted at terminal 245. The operation of the circuit with respect to inputs applied to terminals 210, 214 and 218 is essentially the same as the circuit of FIG. 1. The input current $I_1$ comprises the sum of currents developed by an input voltage $V_1$ applied to terminal 210 by an input voltage $V_2$ applied to terminal 214, and current $I_4$ applied to terminal 218. It is noted that the circuit may employ only one input terminal and corresponding resistance or it may employ several. The relative input impedance values can be varied for different matrixing effects. Further, current inputs can also be applied simultaneously to input terminal 218 as illustrated by the symbol $I_4$ and associated arrow. The inherent low input impedance of the circuit allows matrixing of these various inputs with minimal interaction effects.

The operation of the constant current transistor 220, the variable conduction stage 230 and the output stage 240 is the same as corresponding stages 20, 30 and 40 in FIG. 1, and the above description applies. It may be noted, however, that the voltage applied to the base terminal **220*b* of transistor 220 could comprise a signal voltage in addition to a bias supply for transistor 220. When a signal voltage is applied to base terminal 220*b*, it combines with the aforementioned input voltages. The base-to-emitter voltage of a transistor usually varies nonlinearly with changes in collector current. Therefore, a signal applied to a base terminal will appear distorted at the emitter terminal. By maintaining the collector current of transistor 220 constant, its forward base-to-emitter voltage is held constant. Thus, the voltage present at terminal 220*e* as a result of the application of signal $V_s$ is undistorted. As the input voltage $V_s$ increases in a positive direction tending to increase current flowing in the collector terminal 220*c* of transistor 220, an increase in the voltage drop across collector resistor 222 will provide a decreasing signal voltage to the base terminals 230*b* and 240*b* of transistors 230 and 240, respectively, via coupling means 225. This decreasing signal on these basis will reduce the collector currents flowing in transistors 230 and 240 to tend to maintain the collector current in transistor 220 constant. The decrease in collector current will reduce the voltage drop across collector impedance 242 associated with transistor 240 and therefore produce an output voltage at terminal 245** which is in phase with applied voltage $V_s$.

It is noted that as input voltage $V_1$ or $V_2$ increase in a positive direction, a phase reversal takes place with respect to the output voltage at terminal 245 as is true when current input such as $I_4$ is applied.

The following equation illustrates the signal voltage relationships of FIG. 2:

$$V_{245} \cong \left[ \frac{V_s}{R_{212} \| R_{216}} - \frac{V_1}{R_{212}} - \frac{V_2}{R_{216}} - L_4 \right] R_{242} \frac{A_{240}}{A_{230}}$$

where $\frac{A_{240}}{A_{230}}$ is the ratio of the base-emitter junction area of transistors 240 and 230 and the current densities in these junctions are equal. The denominator of the $V_s$ term is the resistance of the combination of parallel resistors 212 and 216.

The current sampling circuit of FIG. 1 can further be utilized to generate a negative impedance useful, for example, as a Q-multiplier. Input terminal 10 can be serially coupled to a resistor which is parallely coupled to a resonant circuit. The current through this resistance which is in phase with the voltage across the reactive elements of the resonant circuit will thereby provide the input signal for sampler 20. The resultant output current from terminal 45 or 55 of output circuits 40 or 50 respectively can be returned to the opposite end of the resonant circuit by means of a current inverter. The magnitude of this inverted current can be adjusted to compensate for resistive losses in the resonant circuit thereby raising the Q of the system.

Although the preferred embodiment of the present invention is integrated on a monolithic integrated circuit chip, the circuit may be constructed utilizing discrete components. Further, a variety of input and output means may be employed, the use of resistances in the figures is merely illustrative. The output circuit 50 of FIG. 1 may also be employed in the circuit of FIG. 2.

What is claimed is:

1. An electrical circuit comprising in combination:
a variable conduction transistor having base, emitter and collector electrodes,
means for providing a signal input circuit coupled between said collector and emitter electrodes,
feedback means, including a source of substantially constant current, coupled between said collector and base electrodes and responsive to signals supplied to said input circuit for varying conduction of said transistor, and
means, including an output transistor having base, emitter and collector electrodes, for providing a signal output circuit, said base and emitter electrodes of said output transistor being coupled in parallel with said base and emitter electrodes of said variable conduction transistor and said collector electrode of said output transistor being adapted for coupling to an output load.

2. A circuit as defined in claim 1 wherein said constant current source is coupled in series with the collector-to-emitter current path of said variable conduction transistor.

3. A circuit as defined in claim 2 wherein said constant current source comprises:

a transistor having base, emitter and collector electrodes; said base electrode being coupled to a source of voltage, said emitter electrode being coupled to said collector electrode of said variable conduction transistor, and said collector electrode being coupled to a source of operating voltage and to said base electrode of said variable conduction transistor.

4. A circuit as defined in claim 3 wherein said feedback means further comprises a resistance coupled between the collector of said transistor of said constant current source and said source of operating voltage.

5. A circuit as defined in claim 3 wherein said source of voltage coupled to said base electrode of said transistor in said constant current source is a direct reference voltage.

6. A circuit as defined in claim 4 wherein said source of voltage coupled to said base electrode of said constant current transistor is an alternating signal voltage.

7. A signal translating stage including in combination:

first and second transistors each having base, emitter and collector electrodes, a source of operating voltage, means for coupling the collector-emitter current paths of said first and second transistors in series across said source, voltage translating feedback means for coupling the collector electrode of said first transistor to the base electrode of said second transistor, means for applying an input signal to the collector electrode of said second transistor, a third transistor having base, emitter and collector electrodes, said second and third transistors being thermally coupled and having proportionally related conduction characteristics, means for coupling the base and emitter electrodes of said third transistor in parallel with the base and emitter electrodes respectively of said second transistor, and means for extracting an output signal from the collector electrode of said third transistor.

8. A circuit as defined in claim 7 and further including:

means for applying a further input signal to the base electrode of said first transistor.

9. An electrical circuit comprising in combination:

a first transistor having base, emitter and collector electrodes, a second transistor having base, emitter and collector electrodes, the collector of said second transistor being direct current coupled to the emitter of said first transistor to define a current path from a source of power to ground, means for applying an input signal to said collector electrode of said second transistor, feedback circuit means for coupling said collector electrode of said first transistor to said base electrode of said second transistor, a third transistor having base, emitter and collector electrodes wherein said base electrode is coupled to said base electrode of said second transistor, and said second and third transistors are thermally coupled, and means for receiving an output signal from the collector electrode of said third transistor.

10. A circuit as defined in claim 9 wherein a direct reference voltage is applied to said base electrode of said first transistor.

11. A circuit as defined in claim 9 wherein a source of input signals is applied to said base electrode of said first transistor.

12. A current sampling circuit comprising:

a first transistor having base, emitter and collector electrodes wherein said collector electrode is coupled to a source of power and said base electrode is coupled to a reference voltage, a second transistor having base, emitter and collector electrodes wherein said collector electrode is coupled to said emitter electrode of said first transistor and to a signal input terminal, feedback circuit means coupling said collector electrode of said first transistor to said base electrode of said second transistor, a third transistor having base, emitter and collector electrodes wherein said base electrode is coupled to said base electrode of said second transistor and said second and third transistors are thermally coupled, and means for extracting an output signal from said collector electrode of said third transistor.

13. A circuit as defined in claim 11 wherein said feedback circuit means includes a zener diode.

14. An electrical circuit comprising in combination:

a first transistor having base, emitter and collector electrodes, a second transistor having base, emitter and collector electrodes, the collector of said second transistor being direct current coupled to the emitter of said first transistor, the combination being coupled from a power source to ground, means for applying a voltage to said base electrode on said first transistor, means for applying an input signal to said collector electrode on said second transistor, .

a feedback path coupled from said collector electrode on said first transistor to said base electrode on said second transistor, a third transistor having base, emitter and collector electrodes, said third transistor thermally coupled to said second transistor, said base electrode on said third transistor coupled to said base electrode on said second transistor, said emitter electrode on said third transistor coupled to ground whereby collector current in said third transistor is at a predetermined phase relationship to collector current flowing in said second transistor, and means for extracting an output signal from said third transistor.

15. A circuit as defined in claim 14 wherein said voltage applied to said base terminal on said first transistor is a direct reference voltage.

16. A circuit as defined in claim 14 wherein said voltage applied to said base terminal of said first transistor is a signal voltage.

17. An electrical circuit comprising in combination:

a first transistor having base, collector and emitter electrodes, a second transistor having base and emitter electrodes and a collector electrode direct current coupled to said emitter of said first transistor and including feedback circuit means for applying signals appearing at said collector electrode on said first transistor to said base electrode on said second transistor, means for applying an input signal to said collector electrode on said second transistor, a third transistor having base, collector and emitter electrodes, said last-named base being coupled to said base electrode of said second transistor, said emitter electrode of said third transistor coupled to a predetermined reference potential bearing a fixed relationship to the emitter voltage on said second transistor, said third transistor being thermally coupled to said second transistor whereby collector current in said third transistor is in phase with collector current in said second transistor and has a magnitude related to the respective base-emitter areas of said third and second transistors, and means for extracting an output signal from said third transistor.

* * * * *